May 10, 1960

R. N. HALL 2,936,256

SEMICONDUCTOR DEVICES

Filed June 1, 1954

Inventor:
Robert N. Hall,
by Paul A. Frank
His Attorney.

United States Patent Office 2,936,256

Patented May 10, 1960

2,936,256

SEMICONDUCTOR DEVICES

Robert N. Hall, Schenectady, N.Y., assignor to General Electric Company, a corporation of New York Application June 1, 1954, Serial No. 433,450

5 Claims. (Cl. 148—33)

My invention relates to semiconductor devices, and, more particularly, to such devices of the broad area P–N junction type.

Semiconductors, such as germanium and silicon, have been conventionally classified as either positive (P-type) or negative (N-type), depending primarily upon the type and sign of their predominant electrical conduction carriers. Whether a particular semiconductor body exhibits P-type or N-type characteristics is dependent primarily upon the predominant type of significant impurity element or activator present within the semiconductor body. Some impurity activator elements such as arsenic, antimony and phosphorus, known as donors, function to furnish additional electrons to the semiconductor body, producing an N-type semiconductor with an excess of electrons. Other impurity activator elements, such as aluminum, gallium and indium, known as acceptors, function to remove electrons from the semiconductor lattice structure and form a P-type semiconductor body with a deficiency of electrons or an excess of "positive holes," which comprise positive conduction carriers. P–N junction semiconductor devices, such as those disclosed in application Serial No. 187,490, William C. Dunlap, filed September 29, 1950, now abandoned, and assigned to the same assignee as the present invention, have a zone of P-type semiconductor material adjoining a zone of N-type semiconductor material to form an internal space charge barrier having a relatively broad area junction as distinguished from the point contact type of semiconductor device. P–N junctions of this nature possess marked rectifying properties as well as thermoelectric and photoelectric properties. Two or more P–N junctions may be incorporated within a single semiconductor device in order to produce a three- or four-terminal amplifying device known as a transistor. The rectifying properties of such a P–N junction are such that when the semiconductor body incorporating the junction is connected to a voltage with a certain polarity there is a free flow of conduction carriers through the body. This polarity is known as the forward direction of flow. When the semiconductor body is connected to a voltage having the opposite polarity, the internal space charge barrier presents a high impedance to the flow of conduction carriers and there is little appreciable flow of current through the semiconductor body, providing the applied voltage is maintained below the critical or breakdown voltage, at which the internal space charge barrier is ruptured.

P–N junctions within semiconductor bodies may be formed in a number of ways. When a semiconductor device is of the extended area, P–N junction type, one method of forming a P–N junction within the semiconductor body may be an alloying process in which a donor or acceptor activator material is brought into contact at high temperature with one surface of a semiconductor body, usually a wafer of small thickness. The acceptor or donor impurity activator is then fused with and diffused into the semiconductor body at high temperatures. When, under high temperatures, a conductivity-type-inducing activator material fuses to and diffuses within a semiconductor body of opposite conduction characteristics, the region into which the activator impurity diffuses changes from its original conduction characteristic type semiconductor material. The region between the two different type semiconductor materials thus forms a P–N junction. P–N junction semiconductor devices have, to a large extent, been limited to small area units because the available acceptor activator elements form alloying eutectics with semiconductors such as germanium and silicon which are extremely brittle and non-durable. This results in cracking, crazing and cleavage between the alloyed surface and the body of the semiconductor material during cooling after alloying.

One object, therefore, of the present invention is to provide an acceptor contact material for semiconductor devices having improved electrical and mechanical properties over a wide range of temperatures.

A further object of the invention is to provide extended area P–N junction semiconductor devices having desirable electrical and mechanical properties over a wide range of temperatures.

In accordance with one feature of this invention, there is provided as an acceptor contact material for P–N junction semiconductor devices, an acceptor alloy of gallium and aluminum. This acceptor material possesses a heretofore unavailable combination of desirable electrical and mechanical characteristics which makes possible improved extended area P–N junction devices, as for example, rectifiers and transistors.

The novel features which are believed characteristic of the invention are set forth in the appended claims. The invention itself, together with further objects and advantages thereof, may best be understood by reference to the following description taken in connection with the accompanying drawing, in which:

Figures 1, 2, 4:
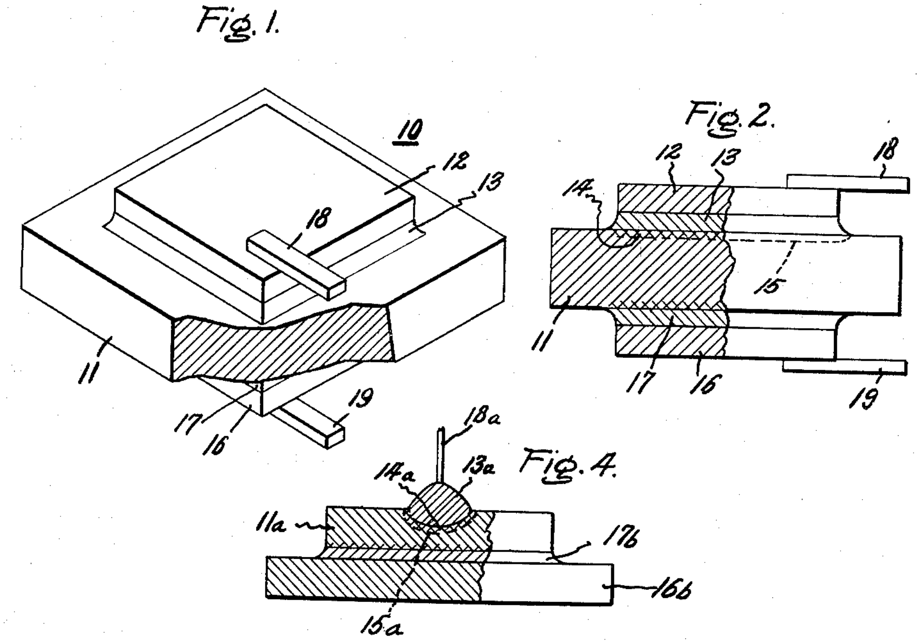
Fig. 1 is a perspective view of a P–N junction semiconductor device embodying the invention.
Fig. 2 is a cross-section view of a portion of the device of Fig. 1.
Fig. 4 is a cross-section view of an alternative embodiment for the device of Fig. 1.

Extended area P–N junction semiconductor units, with which this invention is concerned, may be produced in a number of ways. One common method of production is by the fusion and diffusion of an impurity activator element to and within the surface of a thin wafer of semiconductor material as, for example geranium or silicon. According to one feature of this method of production, a thin wafer of crystalline, N-type germanium or silicon is prepared according to methods which are well known and will not be herein discussed. Such a crystalline, N-type semiconductor wafer is then brought into surface contact with an impurity activator element of the type capable of inducing positive conduction carriers in the semiconductor and a penetration of the impurity material to the desired depth within the semiconductor is effected by any suitable manner. The most common manner, however, is thermal alloying and diffusion. In such a process a small amount of impurity activator material may be placed upon the surface of a semiconductor wafer into which a P–N junction is to be induced, and held thereon with pressure while the two elements and subjected to a high temperature sufficient to cause partial alloying of the semiconductor with the activator impurity. After proper alloying and diffusion have taken place, the semiconductor body may be allowed to cool and a low resistance contact soldered or otherwise connected to the exterior surface of the semiconductor body. Alternatively, the impurity activator material may serve as a solder to bond a low resistance contact to the semiconductor body in a single step. In producing a semiconductor device of this type, however, many difficulties arise. Presently available acceptor alloys for germanium and silicon such as aluminum, gallium, and indium are not mechanically ideal for forming broad area contacts with those semiconductor materials. Gallium is a liquid at room temperatures and is not suitable. Indium has a low melting point (155° C.) and is limited in use to low temperatures. The thermal coefficients of expansion of the eutectics formed by aluminum with germanium and silicon are markedly different from the thermal coefficients of expansion of germanium and silicon. Such differences cause thermal strains which can damage or ruin a broad area contact between an activator and a semiconductor body. When aluminum is used to form a broad area P–N junction with germanium or silicon a brittle junction is formed and during cooling after alloying, the brittle alloy between the activator element and the silicon semiconductor body will ordinarily crack or craze and render the semiconductor device useless. An additional factor makes available acceptor elements unsuitable for forming extended area contacts with silicon. Silicon is not readily wet by alloying materials. Pure indium does not wet silicon readily. Additions of other metals to indium to cause wetting tends to destroy the acceptor characteristics of indium. Hence, neither aluminum, gallium or indium may be used as an acceptor activator contact for an extended area silicon rectifier or semiconductor device.

I have found that, although gallium and aluminum are individually not suited as broad area acceptor activator contacts for germanium and silicon semiconductor bodies, a mixture of gallium in aluminum results in an alloy which is sufficiently solid at normal semiconductor device operating temperatures to provide the required mechanical strength. This alloy, when fused to a semiconductor body to form a P–N junction therewith, or merely to supply positive conduction carriers thereto, is, nevertheless, able to withstand large temperature variations without shearing from the semiconductor, cracking or crazing. There is provided, therefore, an acceptor activator material for semiconductor devices which has desirable electrical and mechanical characteristics and which readily wets silicon. Therefore, while this activator material may be used effectively with both germanium and silicon, it is particularly useful with silicon, for which no other acceptor activator suitable for extended area contacts at any temperature has been heretofore available.

In a preferred form of my invention the diffusion of the acceptor activator alloy material is combined with attaching of a low resistance contact to the semiconductor device by using the acceptor activator material as a solder between the two. This is accomplished by heating a semiconductor wafer, a portion of acceptor activator material, and a low resistance contact together in sandwich fashion at a temperature and for a period of time sufficient to cause the desired degree of impurity penetration and bonding.

In Fig. 1 there is shown one type of P–N junction semiconductor unit made in accordance with the present invention. This device, denominated generally as 10, is an extended area semiconductor rectifier, comprising an N-type semiconductor wafer 11 and two low resistance electrodes 12 and 16, which may conveniently be nickel or fernico in electrical contact with opposite major faces of wafer 11. Low resistance electrode 12 is fastened to wafer 11 by the hereinbefore described acceptor activator solder 13 comprising an alloy of aluminum and gallium which is fused to and diffused within N-type semiconductor wafer 11 causing a surface adjacent region 14 of semiconductor wafer 11 to be transformed into P-type semiconductor. The boundary region between surface adjacent region 14 and the body of wafer 11 forms a broad area P–N junction 15. Acceptor activator solder 13 is an alloy of gallium in aluminum in the range of from 25 to 35% by weight of gallium, and is preferably composed of approximately 30% gallium and 70% aluminum. This acceptor activator alloy acts as a very satisfactory source of acceptor activator atoms to transform surface adjacent region 14 of N-type semiconductor wafer 11 into P-type semiconductor and also forms a sufficiently ductile alloy with semiconductor wafer 11 which allows the wafer to expand and contract with temperature changes without causing cracking, shearing, or crazing between solder 13 and wafer 12. Low resistance electrode 16 is connected with semiconductor wafer 11 by means of solder layer 17 which may be an alloy of a donor activator material which has good thermo-mechanical properties. This alloy may conveniently be an alloy of a small percentage of a donor activator element such as arsenic, antimony and phosphorus, the remainder being indium, as described in application Serial No. 410,609, John S. Saby, filed February 16, 1954, and assigned to the same assignee as the present invention. For this purpose a mixture of 10% to 30% by weight of a donor activator element in indium may be conveniently used. Since the segregation constant of indium in germanium and silicon, that is, the ratio of solid solubility of indium in germanium and silicon to the percentage of indium in the liquid phase upon alloying, is very much smaller than the segregation constant of the donor elements in germanium or silicon, the electrical characteristics of the junction formed by the indium-donor element alloy with the semiconductor wafer are dominated by the donor element. On the other hand, since there is much more indium present in the alloy, it possesses essentially the same mechanical properties as pure indium, that is, the alloy is sufficiently ductible to withstand temperature stress without cracking or crazing and forms a contact having the necessary ductibility for large area contact with semiconductor wafer 11. Additionally, this alloy readily wets germanium and silicon when used as a solder between low resistance electrode 16 and wafer 11. Donor alloy 17 may conveniently be an alloy of 10% to 30% arsenic in indium.

A rectifier 10 as illustrated in Figs. 1 and 2 of the drawing may be constructed according to this invention in the following manner. A wafer 11 of N-type silicon, preferably monocrystalline, is initially provided by being cut from a single crystal of silicon formed with a trace of donor activator element such as antimony, phosphorus, or arsenic to give it negative or N-type conduction characteristics. Wafer 12 may conveniently be a thin piece of silicon of the order of 0.020″ thick. The thickness may, however, vary from very thick wafers to the thinnest possible dimension commensurate with mechanical strength, depending upon the ultimate use of the device. The length and width of the wafer are not critical but may conveniently be approximately ¼″. The forming of P–N junction 15 within the rectifier 10 of Fig. 2 and the simultaneous soldering of electrode 12 to silicon wafer 11 by means of acceptor activator alloy 13 on one hand, and the soldering of electrode 16 to wafer 11 by means of donor activator alloy 17 on the other hand, may be accomplished in one heating operation, or may be performed in two independent operations. According to a preferred procedure both operations may be performed simultaneously. This may be accomplished by placing silicon wafer 11, electrodes 12 and 16 which are preferably of nickel, and thin wafers of donor alloy 17 and acceptor alloy 12 together in sandwich fashion as shown in Fig. 2 in a suitable furnace or other heating chamber. Heating is conducted at a temperature and for a sufficient length of time to cause acceptor alloy 12 to wet, and partially diffuse into silicon wafer 11 so as to form P–N junction 15, but not completely diffuse throughout the body of silicon wafer 11. Complete diffusion would change the entire body of wafer 11 into P-type silicon and no P–N junction would be formed. This temperature may vary somewhat but should be above about 600° C., the temperature at which the silicon wafer 11 first begins to be wet by acceptor alloy 12, and below about 900° C., the temperature at which excessive alloying and diffusion of acceptor alloy 12 into silicon wafer 11 begins to occur. The time of heating may vary somewhat depending upon the thickness of silicon wafer 11. Using a silicon wafer of approximately 0.020" thick, a suitable P–N junction has been found to be formed by a heating at 700° C. of from ¼ to 2 minutes.

A rectifier 10 constructed according to the above method will then be suitable as a rectifying semiconductor device over a large range of temperatures.

Figure 3:
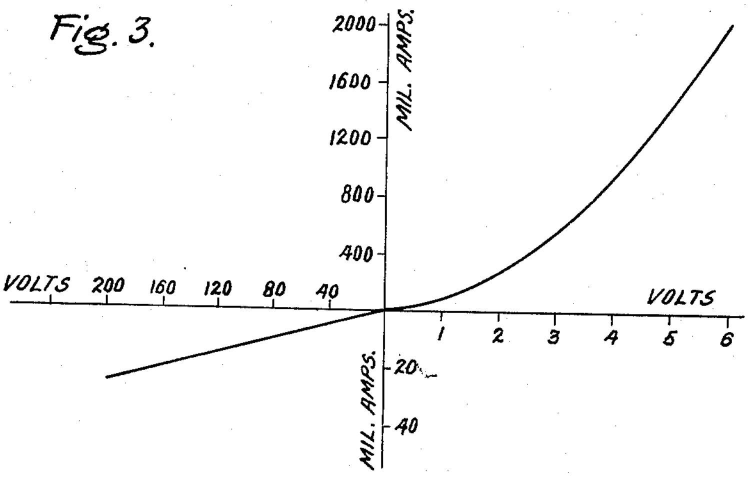
Fig. 3 is an electrical characteristics graph of the device of Fig. 1.

In Fig. 3 there is shown the rectification characteristics of a broad area silicon rectifier made according to this invention using a 20 ohm centimeter N-type silicon wafer 0.020" thick. As may be seen from the curve of Fig. 3, rectifier 10 will pass high currents up to several thousands of milliamperes for voltages of less than 10 volts when connected in the forward or easy-flow direction. When polarity is reversed, the leakage current of rectifier 10 is extremely low, being less than 30 milliamperes for reverse voltages up to 200 volts. The rectifying characteristics of rectifier 10 as shown in Fig. 3 vary extremely little over temperature ranges from liquid nitrogen temperature to 200° C. The forward resistance of this rectifier may be greatly reduced by using a thinner wafer of lower resistivity.

In Fig. 4 there is shown another embodiment of the invention. The rectifier formed in Fig. 3 differs from that of Fig. 2 only in that nickel electrode 13 has been dispensed with, and lead 18 is connected directly to a body of gallium-aluminum acceptor activator material 19 which is fused to and diffused within N-type semiconductor wafer 11*a*.

Figure 5:
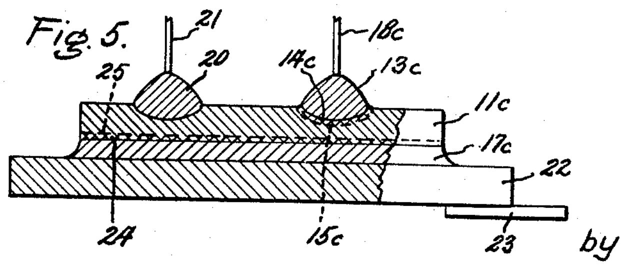
Fig. 5 is a vertical cross-section view of a three-terminal transistor constructed according to this invention.

Another embodiment of my invention is illustrated in Fig. 5, where a three electrode transistor is shown formed from a wafer of N-type semiconductor which is preferably cut from a single crystal of N-type material. A base electrode 20 which may be any donor activator material, as, for instance arsenic or antimony or an alloy of indium and a donor activator, is fused to and within one major face of semiconductor wafer 11. Terminal lead 21 is soldered to electrode 20. An emitter electrode 13*c* comprising the improved acceptor activator alloy of aluminum and gallium, from 25 to 35%, and preferably about 30%, gallium in aluminum, is fused to and within the same major face of semiconductor wafer 11*c*, and heated for a sufficient time and at a sufficient temperature to cause alloying therewith. The diffusion of the activator alloy within semiconductor wafer 11*c* transforms surface adjacent region 14*c* within semiconductor wafer 11*c* into P-type semiconductor and a P–N junction 15*c* is formed between the P-type surface-adjacent region 14*c* and the body of N-type semiconductor wafer 11*c*. Terminal lead 18*c* is connected to emitter electrode 13*c*. A collector electrode 22 to which terminal 23 is connected is furnished for the transistor of Fig. 5 by soldering a good conductor material which may, for instance, be fernico, to the opposite major face of wafer 11*c* with the acceptor alloy of aluminum and gallium as described hereinbefore. This alloy may be from 25 to 35% gallium in aluminum, and is preferably approximately 30% gallium, the remainder being aluminum. Heating to form the solder is conducted at a temperature and for a time sufficient to cause the diffusion of the acceptor alloy within the N-type wafer 11*c* to cause the formation of a surface adjacent region 24 and a P–N junction 25.

It is obvious that, although my invention has been described in connection with specific embodiments, many modifications may be made without departing from the spirit of the invention. It is to be understood, therefore, that I intend by the appended claims to cover all such modifications as fall within the true spirit and scope of the invention.

What I claim as new and desire to secure by Letters Patent of the United States is:

1. A semiconductor device comprising a crystalline semiconductor body selected from the group consisting of germanium and silicon and an acceptor activator material fused to one surface thereof, said acceptor activator material consisting essentially of an alloy of 25 to 35 weight percent of gallium, the remainder being aluminum.

2. A semiconductor device comprising a crystalline semiconductor body selected from the group consisting of germanium and silicon and an acceptor activator material fused to and diffused within a surface adjacent region of said semiconductor body and forming an extended area contact therewith, said acceptor activator material consisting essentially of an alloy of 25 to 35 weight percent of gallium, the remainder being aluminum.

3. A semiconductor device comprising a crystalline N-type semiconductor body selected from the group consisting of germanium and silicon and an acceptor activator material fused to and diffused within a surface adjacent region of said semiconductor body to form a P–N junction therein, said acceptor activator material comprising from 25 to 35% gallium, the remainder being aluminum.

4. The device of claim 3 wherein the semiconductor body consists of N-type silicon.

5. An asymmetrically conducting device comprising a crystalline wafer of N-type silicon, an acceptor activator material comprising from 25 to 35% gallium, the remainder being aluminum, fused to and diffused within one major surface of said wafer to form a P–N junction therein, a donor activator alloy comprising from 10 to 30% by weight of arsenic, the remainder being aluminum, fused to and diffused within the opposite major face of said wafer.

References Cited in the file of this patent

UNITED STATES PATENTS

| | | |
|---|---|---|
| 2,369,354 | Kempf | Feb. 13, 1945 |
| 2,579,369 | Dawe | Dec. 18, 1951 |
| 2,694,024 | Bond | Nov. 9, 1954 |
| 2,701,326 | Pfann | Feb. 1, 1955 |
| 2,705,767 | Hall | Apr. 5, 1955 |
| 2,725,315 | Fuller | Nov. 29, 1955 |